US006999018B2

(12) United States Patent
Aeby et al.

(10) Patent No.: US 6,999,018 B2
(45) Date of Patent: Feb. 14, 2006

(54) DEVICE AND METHOD OF FITTED VARIABLE GAIN ANALOG-DIGITAL CONVERSION FOR AN IMAGE SENSOR

(75) Inventors: Fabien Aeby, Avenches (CH); Laurent Genilloud, Romont (CH)

(73) Assignee: Asulab S.A., Marin (CH)

( * ) Notice: Subject to any disclaimer, the term of this patent is extended or adjusted under 35 U.S.C. 154(b) by 0 days.

(21) Appl. No.: 10/853,113

(22) Filed: May 26, 2004

(65) Prior Publication Data

US 2004/0246154 A1 Dec. 9, 2004

(30) Foreign Application Priority Data

Jun. 3, 2003 (EP) ................................ 03012594

(51) Int. Cl.
*H03M 1/12* (2006.01)

(52) U.S. Cl. ...................... 341/155; 341/382; 341/274

(58) Field of Classification Search ................ 341/155, 341/156, 164, 165, 159; 382/271, 272, 273, 382/274

See application file for complete search history.

(56) References Cited

U.S. PATENT DOCUMENTS 4,733,217 A 3/1988 Dingwall
5,920,274 A * 7/1999 Gowda et al. .............. 341/155
6,326,910 B1 * 12/2001 Hayduk et al. ............. 341/137
2002/0067303 A1 * 6/2002 Lee et al. .................. 341/184
2002/0140842 A1 10/2002 Olding et al.
2003/0189209 A2 * 10/2003 Tay ............................ 257/72
2004/0233312 A1 * 11/2004 Tay ............................ 348/308

FOREIGN PATENT DOCUMENTS

EP 567 145 A2 10/1993

OTHER PUBLICATIONS

Single-Chip CMOS Image Sensor for Mobile Applications, Kwangho Yoon et al, IEEE Journal of Solid-State Circuits, vol. 37, No. 12, Dec. 2002, pp. 1839-1845.

* cited by examiner

*Primary Examiner*—Peguy JeanPierre
(74) *Attorney, Agent, or Firm*—Sughrue Mion, PLLC

(57) ABSTRACT

The variable gain analog-to-digital conversion device (1) for an image sensor comprises at least one N-bit non-linear coarse first converter (21) receiving a pixel voltage signal (Vpix) and at least one M-bit linear fine second converter (22) connected to the first converter (21) in order for the device to supply a binary word of N+M bits relating to the voltage level of the pixel. The first converter (21) comprises comparison means (33) for comparing the voltage level of the pixel with one or more voltage thresholds (V0 to V4) delimiting voltage ranges within the voltage dynamic range of the sensor. The successive voltage ranges represent areas of illumination of the pixel ranging from a weakly lit area to a strongly lit area. The first comparator supplies an N-bit binary word relating to the area of illumination determined for the pixel. The second converter comprises conversion adaptation means for converting the voltage pixel signal to a number of bits less than or equal to M, depending on the N-bit binary word from the first converter.

13 Claims, 6 Drawing Sheets

DEVICE AND METHOD OF FITTED VARIABLE GAIN ANALOG-DIGITAL CONVERSION FOR AN IMAGE SENSOR

This application claims priority from Swiss Patent Application 0977/03 filed Jun. 3, 2003, the entire disclosure of which is incorporated herein by reference.

BACKGROUND OF THE INVENTION

The invention relates to a device of fitted variable gain analog-digital conversion. The conversion device preferably converts digitally signals produced by a photosensitive cell of an image sensor. The photosensitive cell is made up of a matrix of pixels.

The conversion device therefore comprises at least one N-bit first converter receiving a voltage or current signal of one pixel and at least one M-bit second converter connected to the first converter, the first and second converters converting the voltage or current level of the pixel to N+M bits. The voltage or current level of the signal produced by each pixel is dependent on a level of light picked up by the pixel in a particular voltage or current dynamic range of the sensor.

The first converter of the device comprises comparison means for comparing the voltage or current level of the pixel with one or more voltage or current thresholds. These voltage or current thresholds delimit successive voltage or current ranges within the dynamic range. Said successive voltage or current ranges within the dynamic range are used to define the illumination of a pixel, ranging from a weakly illuminated pixel to a strong illuminated pixel. The first converter supplies a N-bit binary word whose value relates to the voltage or current range in which the voltage or current level of the pixel is situated.

The variable gain conversion means conversion using a number of bits greater than the number of bits retained for each pixel after conversion. In this way it is possible to apply digital amplification as a function of the level of illumination of the pixels.

The invention relates equally to an image sensor comprising in particular a pixel matrix photosensitive cell, an analog-digital conversion device connected to the cell, an illumination averaging unit connected to the conversion device, and a scale adapter connected to the conversion device and to the averaging unit.

The invention also relates to an analog-digital conversion method for operating the analog-digital conversion device.

To capture an image, a photosensitive cell generally comprises a matrix of pixels in order to supply each signal converted into a voltage representing the number of photons captured, for example. The higher the number of photons, the greater the voltage difference produced. A digital image is usually quantised on 8 bits, i.e. with 256 possible levels. In the case of a colour image, each primary (red, green, blue) component is coded on 8 bits.

In this connection, it is as well to remember that each pixel comprises the capacitance of a junction, such as that of a photodiode, for capturing photons, in particular with a well of 100 000 electrons. In normal operation, this capacitance (photodiode) is reverse biased to a given voltage from 0 to 2 V, for example.

In an image active-pixel sensor (APS) implemented in a CMOS technology, the photons discharge a capacitor to generate electron-hole pairs. The electron-hole pairs are collected by the opposite electrodes of the capacitor and consequently reduce the voltage difference across the capacitor. As this voltage difference decreases with illumination, the polarity of the signal is reversed, i.e. there is a high voltage when the pixel is strongly illuminated and a low voltage in the event of weak illumination. Thus the dynamic range of the sensor voltage is less than the bias voltage of the capacitor, for example equal to 1.5 V. This condition is not limiting, however.

To convert the voltage signals produced by the pixels, the signals must generally be amplified. The amplification depends on the level of illumination of the pixels of the captured image. To amplify the signals, one option is to pre-amplify each pixel signal before analog-digital conversion, for example, as shown diagrammatically in FIG. 1*a*. To do this in the image sensor, a certain number of variable gain amplifiers 101 are each connected to the output of a respective pixel (not shown) to receive a converted voltage Vpix corresponding to the captured illumination, for example. The variable gain amplifier 101 for each pixel amplifies the substantially constant voltage Vpix by an amplification factor Ax to provide an amplified output voltage signal AxVpix. The amplified signal is then converted digitally in a standard 8-bit AD converter 100 to produce an 8-bit binary word Sn.

The amplification factor Ax of the amplifiers is adjusted to the dynamic range of the converter after averaging the levels of illumination of some pixels in particular. This averaging is effected by an illumination averaging unit 102 connected in a feedback loop between the converter 100 and the amplifier(s) 101. A control signal S_Ax for adjusting the amplification factor is supplied to the amplifier by the averaging unit.

To fix the amplification factor, it is necessary to effect a plurality of analog-digital conversions in order to reach an optimum state of the average illumination of the image captured by the pixels, which is a drawback. Another drawback with analog amplification of the voltage of each pixel is that this leads to high power consumption, caused in particular by overworking the image sensor. This therefore makes it difficult to use this kind of sensor in a portable object, such as a wristwatch, which is supplied with power by small batteries or accumulators. What is more, it is difficult to connect a plurality of matched analog amplifiers in parallel in the same semiconductor structure to save time converting an image captured by the pixel matrix.

Another solution for amplifying the pixel signals is to employ digital amplification using a variable gain analog-digital converter of an image sensor as represented diagrammatically in FIG. 1*b*. For this kind of digital amplification, the converted voltage Vpix for each pixel is first digitised using an (8+n)-bit variable gain AD conversion device 110. The binary word produced by the converter 110 is supplied to a scale adapter 111 which is responsible for taking the same eight successive bits from each binary word of (8+n) bits and supplying a binary signal Sn on 8 bits. The choice of the eight successive bits taken from each binary word depends on an illumination average of a subset of pixels of the matrix that has captured an image to be digitised. The illumination average is obtained by means of an illumination averaging unit 112. For example, the illumination averaging unit 112 calculates an average over a plurality of (8+n)-bit binary words from the converter 110 in order to determine which bits are the most representative of the digitised voltage signals Vpix.

Accordingly, with this type of digital amplification, it is possible to defer a decision on the average level of illumination of the image captured by the matrix of pixels, which avoids preliminary exposure control, as is the case with analog amplification. However, with a standard conversion device 110 of this kind, conversion to (8+n) bits is effected under all circumstances of illumination of the pixels, which may be a drawback. Conversion with this accuracy surplus is not always necessary, especially in the event of strong illumination of the pixels of the photosensitive cell, as image sensor noise from the photosensitive cell is greater with strong illumination than with weak illumination. Thus when determining the less significant bits for a strongly illuminated pixel, the converter may convert voltage or current levels lower than the noise of the pixel. This renders this operation superfluous, since it is random, and this is a drawback.

At this connection, one can cite U.S. Pat. No. 4,733,217 which describes a sub-ranging analog to digital conversion device. This conversion device includes a N-bit first coarse converter, which receives a video voltage or current signal, and a M-bit second fine converter connected to the first converter. Said N bits provided by the first converter determine a voltage or current range in which the voltage or current signal is situated within a voltage or current dynamic range. Said voltage or current range is determined within the first converter after signal comparison operations with voltage or current thresholds. A combine element, connected to first and second converters, receives the N bits MSB from the first converter and the M bits LSB from the second converter for supplying a N+M bit binary word.

A drawback of such a conversion device of the hereinabove patent is that it is not able to adapt the conversion of the voltage or current signal as a function of the voltage or current level of analog signal to be converted.

SUMMARY OF THE INVENTION

Thus the main object of the invention is to alleviate the drawbacks of the prior art by providing a variable gain analog-digital conversion device that may be adapted or fitted according to the level of illumination of each pixel of the photosensitive cell. The conversion device is adapted or fitted so that it does not convert noise unnecessarily during capture of an image by the photosensitive cell, for example.

To this end, the invention consists in an analog-digital conversion device as cited hereinabove that is wherein the second converter comprises conversion adaptation means that are configured for the voltage or current range that has been determined between a minimum voltage or current and a maximum voltage or current of said voltage or current range as a function of the value of the N-bit binary word supplied by the first converter, the conversion adaptation means being configured to convert the voltage or current pixel signal to a number of bits less than M for a voltage or current range that has been determined corresponding to a strongly-illuminated pixel or equal to M for a voltage or current range that has been determined corresponding to a pixel that is not strongly illuminated.

One advantage of the analog-digital conversion device of the invention is that the adaptation means of the second converter convert only the useful signal supplied for each pixel, avoiding unnecessary conversion of noise during image capture by the photosensitive cell. The second converter is adapted or fitted to carry out a conversion with no surplus of accuracy, as a function of the binary word produced by the first converter. In order to determine the illumination area of each pixel, this binary word supplied by the first converter depends on the voltage or current level of each pixel. This reduces the energy consumption of the device, in particular during conversion of each voltage or current signal supplied by the pixels.

Because the noise with strong illumination is approximately eight times greater than the noise with weak illumination, weakly lit pixels are preferably converted with a higher resolution than moderately lit or strongly lit pixels. Voltage ranges of different size are therefore defined within the dynamic range, each representing a particular illumination area as a function of the noise difference. Thus eight times more digital amplification is applied to weakly lit pixels than to strongly lit pixels, for example.

In the case of image capture by a photosensitive cell of an APS CMOS image sensor, the noise with weak illumination is close to 1 mV and the noise with strong illumination may have a value close to 8 mV. To prevent the final output on 8 bits containing noise bits, it is necessary to provide digital amplification by a factor of 8, corresponding to three additional bits. In this case of linear conversion on 11 bits (N+M+1 bits), the resolution of the least significant bit is constant over the whole of the dynamic range and is quickly buried in noise. If the pixel is in a strongly illuminated area, the last three less significant bits no longer contain information and there is therefore no point in processing them.

It is possible to reduce the number of bits to be converted by delinearising the N-bit first converter. Knowing that the second converter processes up to M bits in a linear manner (at constant gain), the size of the weak illumination area is fixed so that the accuracy of the least significant bit is equivalent to a standard linear converter of N+M+1 bits over the whole of the dynamic range. In the event of strong illumination, on the other hand, the last bit converted must be eight times less sensitive than the last bit with weak illumination. The second converter therefore converts only a number of bits less than M, also in order to save conversion time and to reduce electrical power consumption.

An additional factor of 2 is therefore needed between the weak illumination conversion gain and the high illumination conversion gain. Consequently, the strong illumination areas are twice as large as the weak illumination area. An area slightly larger than the weak illumination area is suitable for intermediate situations.

The invention also provides an image sensor that has the features referred to the claims.

An advantage of this kind of image sensor according to the invention is that electrical consumption can be greatly reduced by reducing the conversion time with a conversion device having a plurality of first and second converters disposed in parallel with slow and well-optimised structures. However, present day CMOS technology for production of integrated circuits is unable to produce reasonable size converters of more than 10 bits by connecting in parallel several tens of first and second converters. Accordingly, for weakly lit pixels it is necessary for the second converter to effect fine conversion in the first voltage range with a conversion accuracy that corresponds to that of a standard 11-bit linear converter over the whole voltage dynamic range of the sensor.

The invention further provides an analog-digital conversion method that has the features referred to in the claims.

BRIEF DESCRIPTION OF THE DRAWINGS

The aims, advantages and features of the analog-digital conversion device, the image sensor and the method for operating the device will become more clearly apparent in the course of the following description of embodiments of the invention, which is given with reference to the drawings, in which.

DETAILED DESCRIPTION OF THE INVENTION

In the following description, electronic components of the variable gain analog-digital conversion device and conversion steps that are well-known to the person skilled in this art are not explained in detail.

Figure 1A:
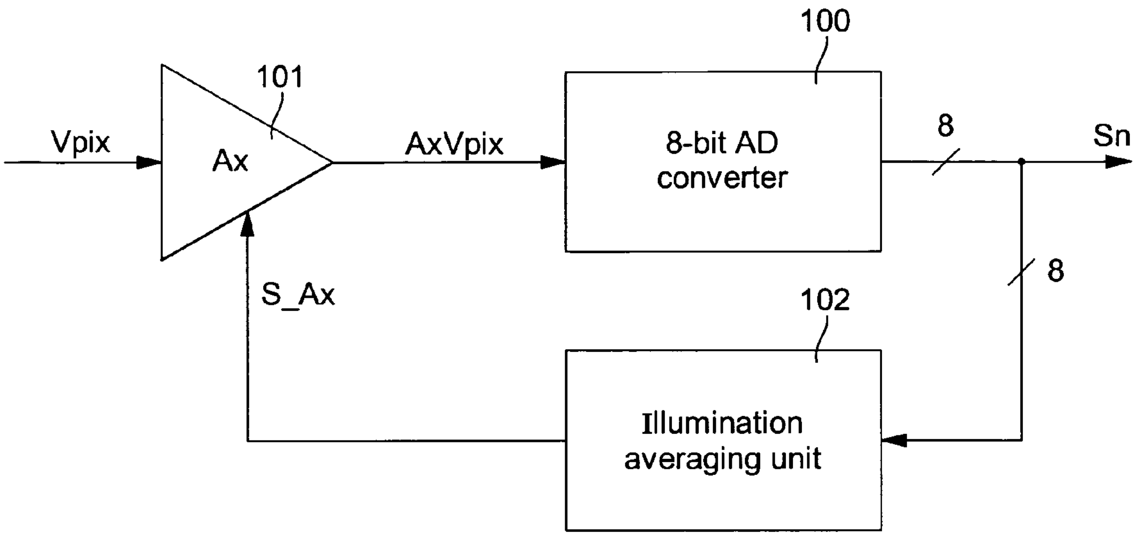
FIG. 1*a*, already cited, depicts diagrammatically part of analog-digital conversion of the voltage supplied by each pixel in a prior art image sensor employing variable gain analog amplification.
Figure 1B:
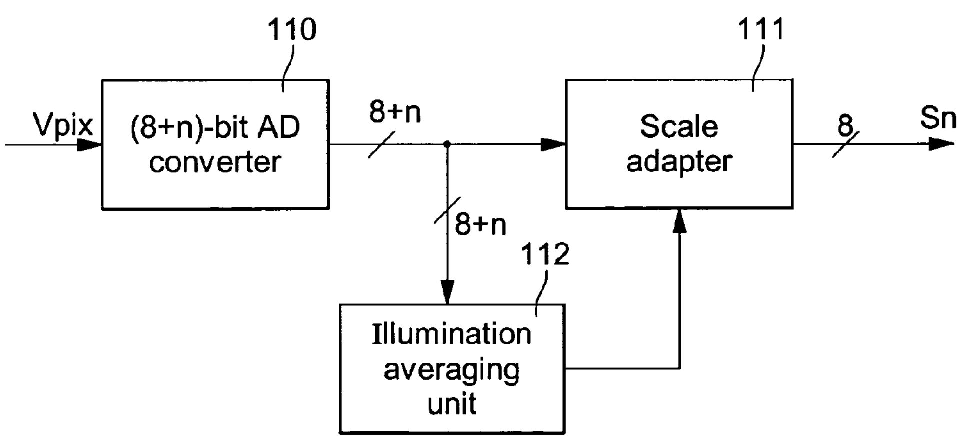
FIG. 1*b*, already cited, depicts diagrammatically part of analog-digital conversion in a prior art image sensor employing digital amplification after the conversion phase.
Figure 2:
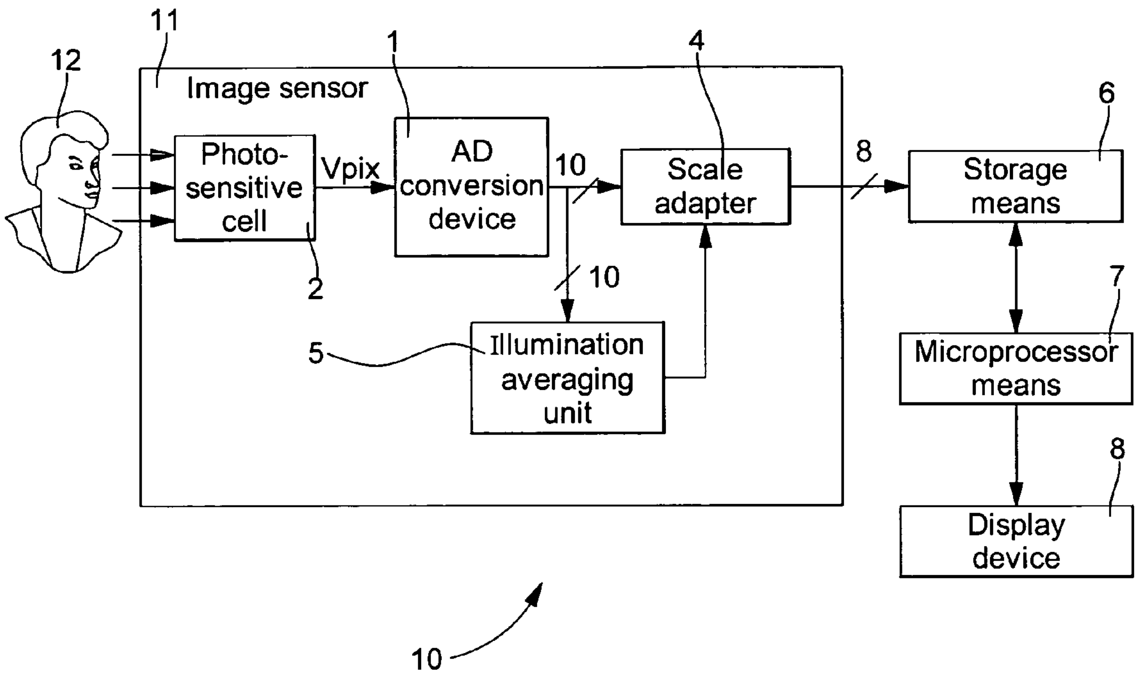
FIG. 2 depicts diagrammatically an imaging system adapted to be fitted to a portable object, such as a wrist-watch, which comprises a fitted variable gain analog-digital conversion device according to the invention.

In FIG. 2, an image capture system 10, in particular of the APS type, includes a variable gain analog-digital conversion device 1 according to the invention. The system essentially comprises an image sensor 11, which is made up of a photosensitive cell with a matrix of pixels 2 for capturing an image 12, the device 1 of analog-digital conversion of the signals supplied by the pixels of the sensor, an illumination averaging unit 5, a scale adapter 4, means 6 for storing the digitised image, a microprocessor unit 7 and a captured image display device 8. The matrix of pixels of an APS video graphics array (VGA) image sensor comprises 640 by 480 pixels, for example, operating over a dynamic range of approximately 1.5 V.

The conversion device 1 that is the subject matter of the invention supplies 10 -bit binary words relating to the conversion of voltage signals produced by pixels of the cell 2. These binary words may be stored in corresponding registers, not shown, of the device 1 after sequential or parallel conversion operations. The illumination averaging unit 5 then receives a certain number of 10-bit binary words from registers of the device, for example, to determine an illumination average for said binary words.

The scale adapter 4 receives a control signal from the averaging unit 5 that is a function of the result of the averaging effected by the illumination averaging unit 5. Thus the adapter, configured by the averaging unit 5, selects eight successive more significant bits from the 10 bits of each binary word produced by the analog-digital conversion device 1, as a function of the average level of illumination of the captured image. For a strongly illuminated image captured by the pixels of the photosensitive cell 2, only the top eight more significant bits of each binary word are retained, whereas for a weakly illuminated image only the bottom eight less significant bits are retained.

All the voltage or current pixel signals digitised on 8 bits are thereafter stored in memory means 6, such as a non-volatile EEPROM, under the control of the microprocessor unit 7. In a manner that is known in the art, the microprocessor unit 7 executes specific calculations to store in the memory means 6 all of the bytes of the matrix of pixels in accordance with a particular format. This format may be the Joint Photographic Experts Group (JPEG) format, for example. The image stored in this way may be viewed on the display device 8, which may be a colour LCD screen.

Figure 3:
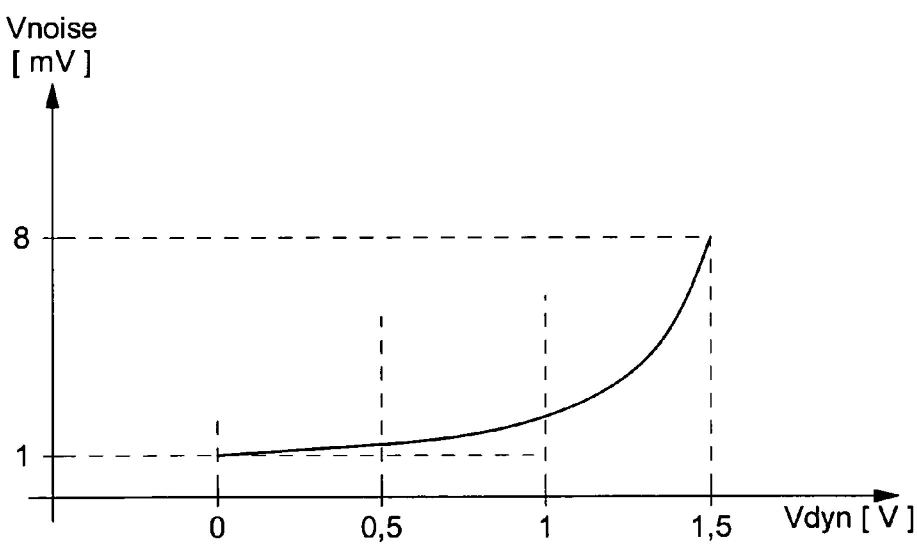
FIG. 3 is a graph of rms noise voltage as a function of the potential of the dynamic range of the image sensor.

Since the noise produced in particular by the photosensitive cell of the sensor is not constant over the whole of the voltage dynamic range of the sensor, the analog-digital conversion device must be configured to take account of the difference in noise between weakly illuminated and strongly illuminated pixels. FIG. 3 is a graph showing the variation of the noise as a function of the voltage level produced by each pixel in the voltage dynamic range of the sensor as a function of the level of illumination of the pixels. Note that for an APS VGA image sensor implemented in a CMOS technology, the noise with weak illumination, close to the bottom voltage of the dynamic range, has a value of approximately 1 mV, while the noise with strong illumination, close to the top voltage of the dynamic range, has a value of approximately 8 mV. Because of this, the conversion device must be able to convert weakly lit pixels with a higher resolution than more strongly lit pixels, by applying appropriate or fitted digital amplification. The amplification for conversion of weakly lit pixels of the device must therefore be eight times greater in an area of weakly lit pixels than in a strongly lit area.

Figure 4:
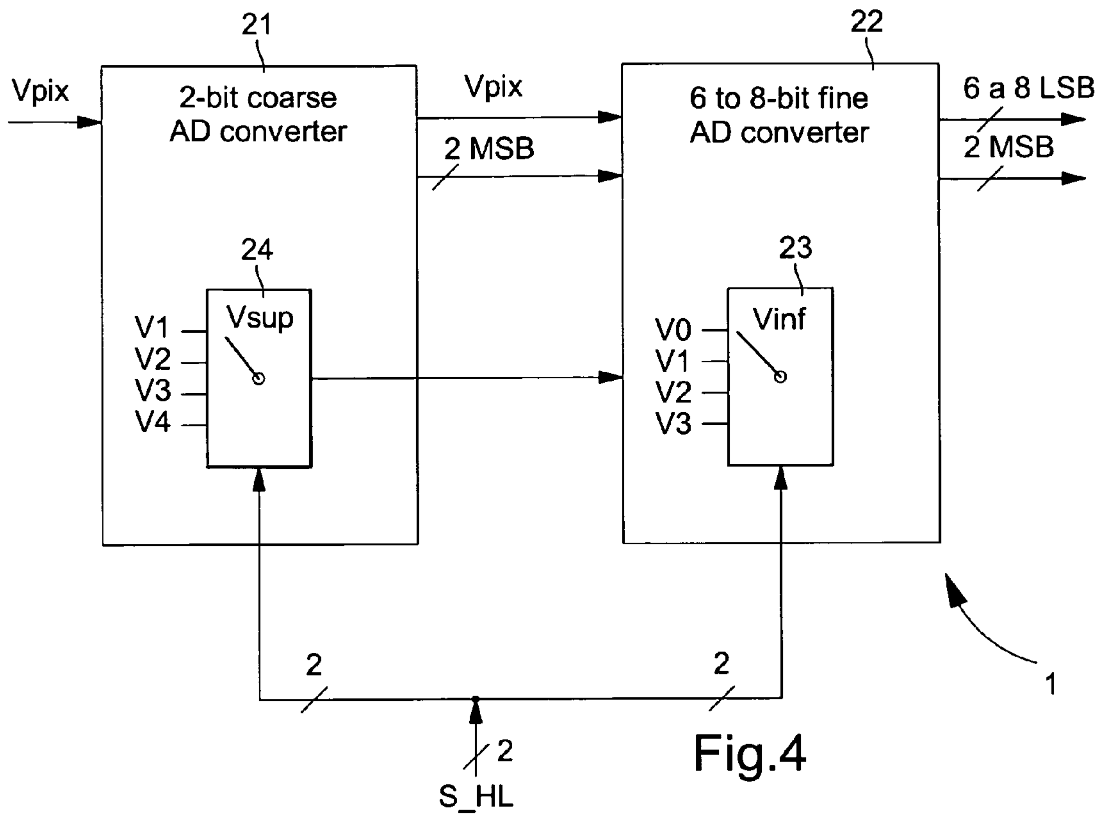
FIG. 4 depicts diagrammatically the analogdigital conversion device according to the invention with its first and second converters.

The variable gain analog-digital conversion device that is the subject matter of the invention is depicted diagrammatically in FIG. 4. This device essentially comprises at least one coarse non-linear first converter 21 and at least one fine linear second converter 22 for converting a voltage signal Vpix supplied by a pixel. The first converter 21 supplies a binary word with N more significant bits, for example two more significant bits, and the second converter supplies a binary word with M less significant bits, for example eight less significant bits. In this way the device supplies a binary word of N+M bits, for example 10 bits, corresponding to the converted voltage signal Vpix from each pixel.

In a first conversion stage, the first converter 21 receives the converted voltage Vpix of each pixel. The function of this first converter 21 is to place the voltage level of the pixel in one of the voltage ranges within the voltage dynamic range of the image sensor. That dynamic range is therefore divided into a plurality of successive voltage ranges delimited by voltage thresholds V1 to V3 between a bottom voltage V0 and a top voltage V4 of the voltage dynamic range. Given that in this embodiment there are three voltage thresholds, four voltage ranges each define a particular area of illumination of each pixel, ranging from a weakly lit area to a strongly lit area.

The first converter comprises comparison means, not shown, for comparing the pixel voltage level with voltage thresholds V1 to V3 supplied successively by a multiplexer 24 with a top reference voltage Vsup to determine the voltage range of each pixel. To this end the multiplexer 24, which receives at its input the three voltage thresholds V1 to V3 as well as the voltage V4 at the top of the dynamic range, is controlled by a 2-bit control signal S_HL. This control signal may be incremented from a first binary value equal to 00 to a fourth binary value equal to 11, as explained hereinafter with reference to FIG. 8. With the first value of the control signal S_HL, the voltage Vpix is compared to the first voltage threshold V1. If the voltage Vpix is higher than the first voltage threshold V1, the control signal is incremented by one unit to compare the voltage Vpix to the second voltage threshold V2. If the voltage Vpix is higher than the second voltage threshold V2, the control signal is again incremented by one or two units, until the voltage Vpix is correctly placed relative to the dynamic range.

Of course, the values of the control signal S_HL indicated hereinabove are given by way of example only, and may be organised differently for selecting one of the voltage thresholds with which to compare the voltage Vpix.

Once the voltage Vpix has been placed in one of the illumination areas, the binary word with two more significant bits supplied by the first converter is defined by the value of the control signal S_HL. This 2-bit binary word is used to configure the second converter 22 so that it operates inside the selected voltage range containing the voltage Vpix.

The second converter 22 includes a multiplexer 23 with a bottom voltage Vinf which receives at its input the bottom voltage V0 of the dynamic range and the three voltage thresholds V1 to V3. This multiplexer is controlled by the same control signal S_HL to supply at its output the bottom voltage Vinf. Thus the second converter is configured to operate between the top voltage supplied by the multiplexer 24 and the bottom voltage supplied by the multiplexer 23, as a function of the binary word from the first converter relating to the value of the control signal S_HL. Conversion adaptation means of the second converter enable the latter to convert the voltage signal of the pixel to a number of bits less than or equal to M as a function of these top and bottom voltages of the selected voltage range. As the second converter 22 supplies a binary word with eight less significant bits, the adaptation means enable the second converter to effect a conversion on 8 bits for a first area of weak illumination, 7 bits for a second area of moderate illumination, and 6 bits for third and fourth areas of high illumination. In order for the device 1 to supply a binary word of 10 bits, the bits that are not converted by the second converter are defined arbitrarily.

As it is necessary for the second converter to use a higher resolution for a weakly lit area than for moderate or strong illumination, the size of the voltage ranges varies. This variation in the size of the voltage ranges is used to modify the conversion gain. This size is smaller for a weakly lit area than for a strongly lit area, in order to take account of the difference in noise between the two areas.

Figure 7A:
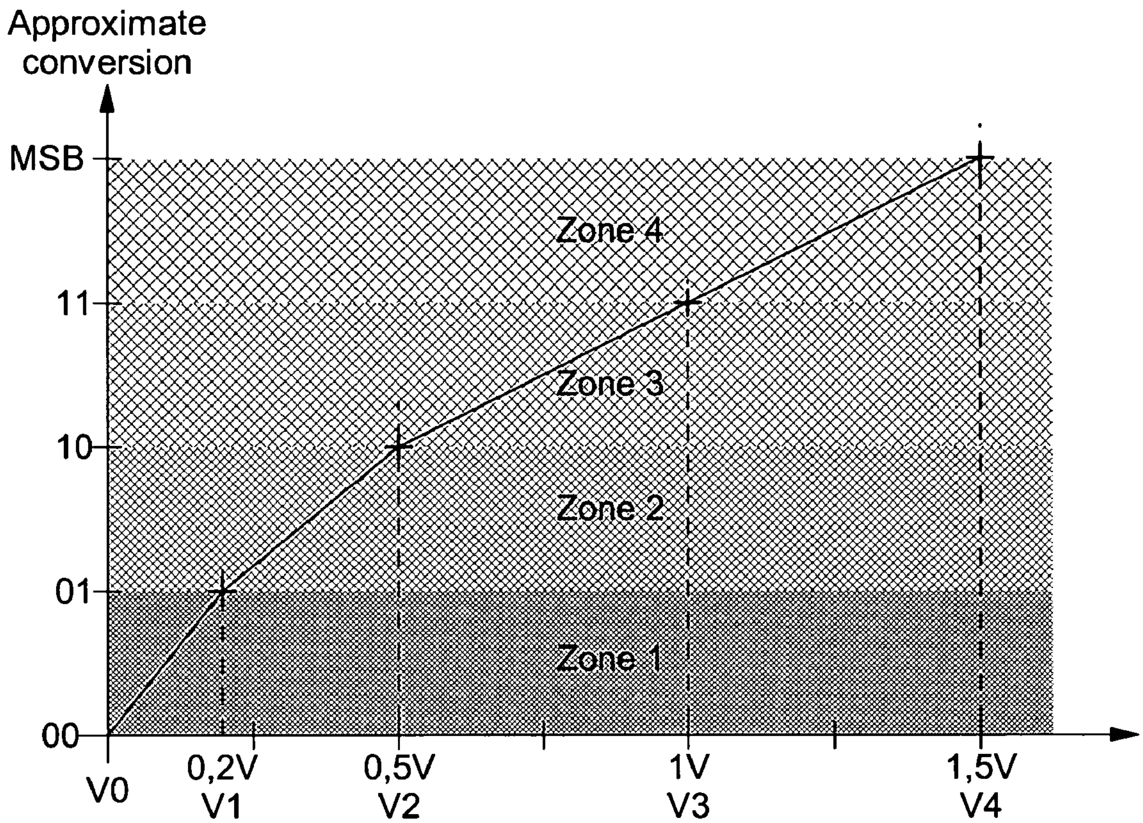
FIGS. 7*a* and 7*b* are respectively a graph of the transfer function of the first converter, defining illumination areas as a function of voltage thresholds of the voltage dynamic range, and a diagrammatic representation of a register for each 10-bit binary word obtained after conversion by the first and second converters.

As shown in FIG. 7*a*, the size of the first voltage range of the dynamic range corresponding to the first illumination area Zone 1 of weakly lit pixels is close to 0.2 V. The size of the second voltage range corresponding to the second illumination area Zone 2 of moderately lit pixels is approximately 0.3 V. Finally, the size of each of the third and fourth voltage ranges corresponding to the third and fourth illumination areas Zone 3 and Zone 4 of strongly lit pixels is 0.5 V. Each area of illumination corresponds to a different binary word supplied by the first converter.

On this subject of the voltage ranges, a conversion gain or sensitivity per conversion bit may be defined by the following formulae:

$$\text{Gain: } A_{conv}=(2^n)/\Delta V_{zone}$$

$$\text{Sensitivity: } S_{conv}=\Delta V_{zone}/(2^n)\ [mV]$$

in which $\Delta V_{zone}$ is the size of the corresponding voltage range and n defines the number of conversion bits of the second converter. For conversion in the first voltage range, the sensitivity per conversion bit is close to 0.8 mV, since the second converter effects conversion on 8 bits. Thanks to the appropriate size of this first voltage range, the conversion accuracy may be considered equivalent to that of an 11-bit linear converter operating over the whole dynamic range. For conversion in the second voltage range, the sensitivity per conversion bit is slightly greater than 2 mV, since the second converter effects conversion on only 7 bits. Finally, for a conversion in the third and fourth voltage ranges, the sensitivity per conversion bit is close to 7.8 mV, as the second converter effects conversion on only 6 bits.

Accordingly, with these sizes of the voltage ranges, it is possible to apply eight times greater amplification to voltage signals of weakly lit pixels compared to the signals of strongly lit pixels. As a result of this, the variable gain analog-digital conversion device is configured to avoid converting noise unnecessarily and to effect conversion with a minimum number of steps.

Figure 7B:
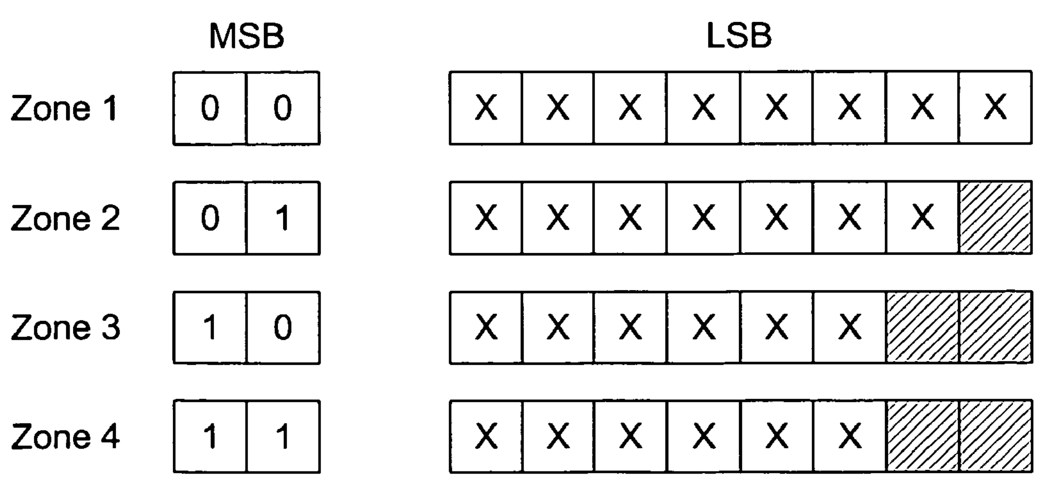

FIG. 7*b* shows a 10-bit register for each pixel binary word in Zone 1, Zone 2, Zone 3 or Zone 4. The two more significant bits MSB are calculated by the first converter to place each pixel in a particular voltage range and the eight less significant bits LSB are defined by the second converter. In Zone 1, the second converter converts the voltage signal of a weakly lit pixel on 8 bits. In Zone 2, the second converter converts the voltage signal of a moderately lit pixel on only 7 bits, without converting the least significant bit, which is buried in noise and therefore represents no information. In Zones 3 and 4, the second converter converts the voltage signal of a strongly lit pixel on only 6 bits, without converting the lowest two less significant bits, which correspond only to noise.

Figure 5:
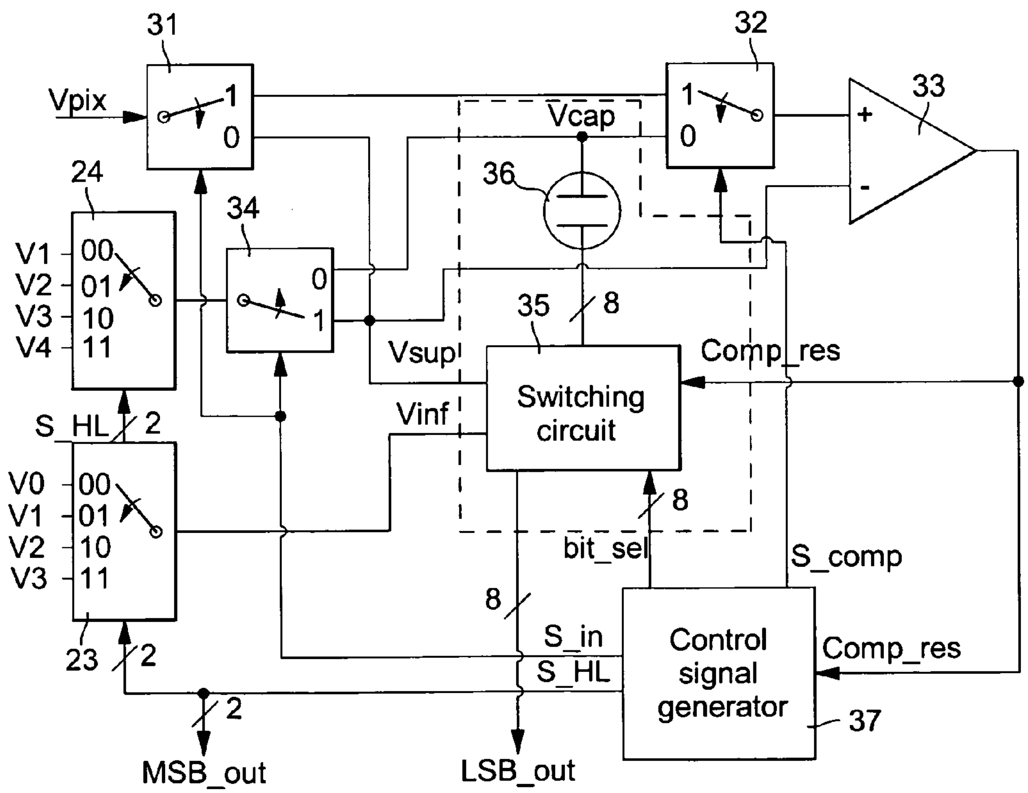
FIG. 5 depicts in more detail the analogdigital conversion device with combined components for the first and second converters.

FIG. 5 shows in more detail the components of the variable gain analog-digital conversion device combining the first and second converters. As also explained hereinafter with reference to FIG. 8, in relation to the conversion method, in a first phase and in successive manner, the first converter must place the pixel voltage Vpix in one of the voltage ranges. To this end, to provide the voltage signal Vpix at the output 1, the demultiplexer 31 is controlled by a control signal S_in. This control signal S_in is produced by a control signal generator 37. The multiplexer 32 receives the voltage Vpix at the input 1. This multiplexer 32 connects the voltage Vpix to the positive input of only one comparator 33 representing the comparison means, as a function of the state of the control signal S_comp produced by the control signal generator 37.

In this first phase, the voltage Vpix must be compared with one of the threshold voltages V1 to V3 supplied by the top voltage multiplexer 24. The voltage threshold selected by the control signal S_HL previously described passes through a demultiplexer 34 that is also controlled by the control signal S_in to supply the selected voltage threshold at the output 1. Initially, the first voltage threshold is selected to be connected to the negative input of the comparator 33.

If the voltage Vpix is greater than this first voltage threshold V1, the output signal Comp_res of the comparator commands the signal generator 37 to increment the control signal S_HL by one unit. Comparing the voltage Vpix and a particular voltage threshold in this way continues until the voltage Vpix can be placed in one of the voltage ranges within the dynamic range. If at the end of the comparison step, the control signal S_HL has the binary value 00, the voltage Vpix is in the first voltage range. If the signal S_HL has the binary value 01, the voltage Vpix is in the second voltage range. If the signal S_HL has the binary value 10, the voltage Vpix is in the third voltage range. Finally, if the signal S_HL has the binary value 11, the voltage Vpix is in the fourth voltage range.

After the top two more significant bits MSB have been determined, the second converter must be able to effect a fine conversion as a function of the voltage range that has been determined. To this end, the second converter includes a switching circuit 35 including conversion adaptation means appropriate to the voltage range that has been determined and an array of switched capacitors 36, shown inside the chain dotted frame.

For the purposes of the conversion operations, and according to the voltage range that has been determined, the switching circuit 35 receives in particular a top voltage Vsup supplied by the multiplexer 24 and a bottom voltage Vinf supplied by the multiplexer 23. The switching circuit, which is explained in more detail hereinafter with reference to FIG. 6, controls the successive connection of eight capacitors with values weighted by powers of 2 to the bottom voltage Vinf or to the top voltage Vsup as a function of the level of the pixel voltage Vpix.

A terminal Vcap of the array of switched capacitors 36 is common to all the capacitors of the array. This terminal Vcap is connected to the positive terminal of the comparator 33 if the control signal S_comp selects the input 0 of the multiplexer 32. In this way, the comparator 33 of the first converter may advantageously be used again in the conversion operations of the second converter.

Fine conversion commences with a charging phase in which the terminal Vcap is first connected to the top voltage supplied by the multiplexer 24 if the control signal S_in selects the output 0. This control signal S_in also enables the demultiplexer 31 to supply the pixel voltage Vpix at its output 0. During the phase of charging the array of capacitors, this pixel voltage Vpix replaces the voltage Vsup at the input of the switching circuit 35.

After this charging step, the terminal Vcap is left floating and is offset by a voltage equivalent to the pixel voltage Vpix if the demultiplexer 34 is switched to the output 1. In this way, using an 8-bit selection signal bit_sel supplied by the control signal generator 37, the fine conversion may be carried out by the second converter. The capacitors of the array 36 are connected successively to the bottom voltage Vinf and then to the top voltage Vsup, as a function of the output signal Comp_res of the comparator 33. As this operation of conversion using an array of switched capacitors is well known in the art, the components constituting this second converter are described only in outline.

Figure 6:
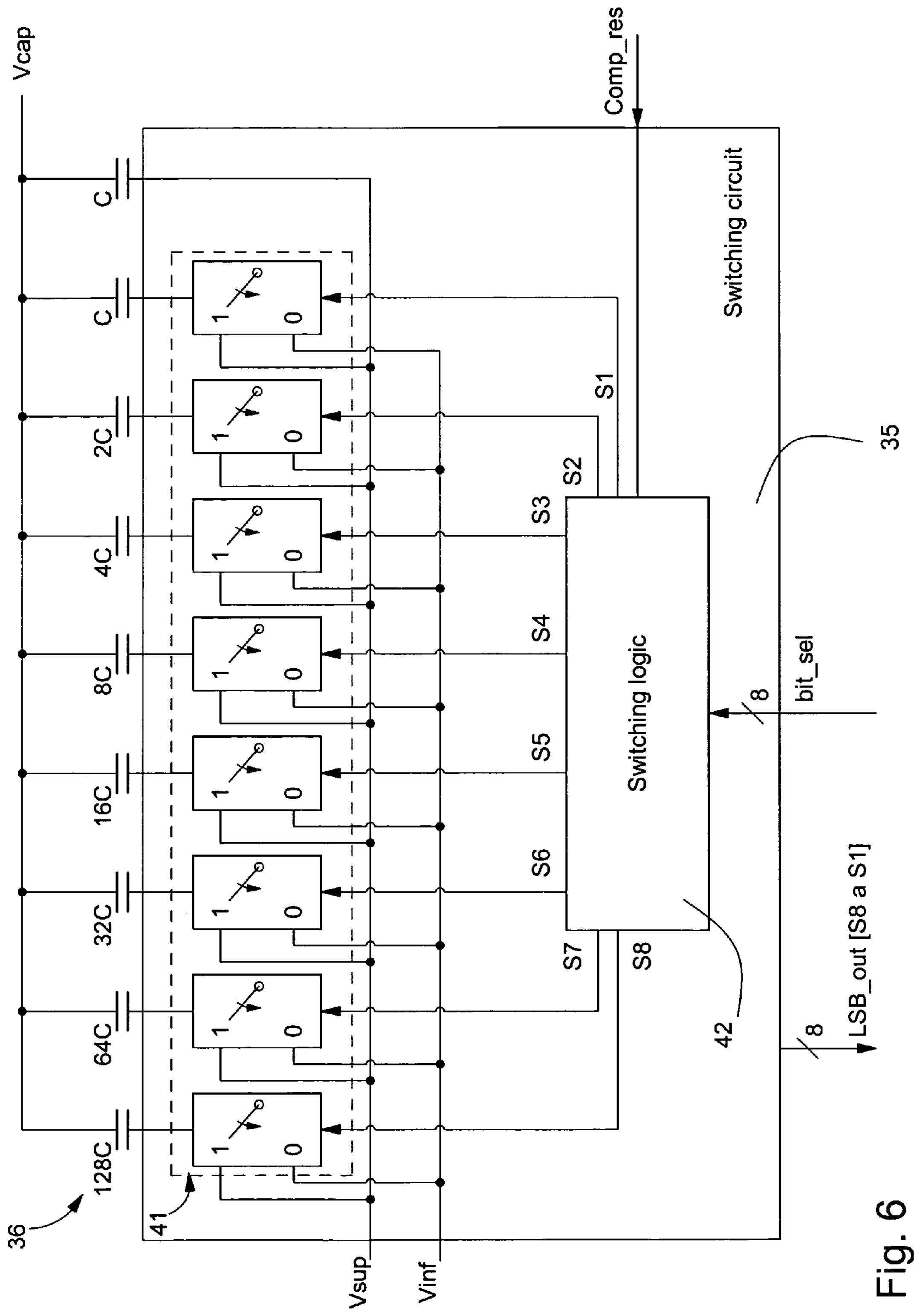
FIG. 6 depicts a portion of the second converter, which comprises an array of switched capacitors weighted to a power of 2, and the switching circuit.

FIG. 6 shows in more detail the main components of the second converter. The switching circuit 35 comprises switching logic 42 for controlling a group of multiplexers 41 depicted inside a chain dotted frame. The output of each multiplexer of the group of multiplexers 41 is connected to one of the eight capacitors of the switched array 36. The value of each capacitor depends on the position of each conversion bit in a binary word determined by the second converter, i.e. on a power of 2. Because of this, the values of the capacitors are defined, from a value C for the least significant bit to a value 128C for the most significant bit. A supplementary capacitor C must be provided in the second converter with one terminal connected to the floating node at Vcap and the other terminal connected to any fixed potential, for example to Vsup.

An input 1 of the multiplexers is connected to the top voltage Vsup of the voltage range that has been determined and an input 0 is connected to the bottom voltage Vinf. In this switching logic, which receives the 8-bit selection signal bit_sel and the output signal Comp_res of the comparator, switching signals S1 to S8 are determined that each commands successively a corresponding multiplexer of the group of multiplexers 41. This switching logic 35 successively switches each capacitor to the bottom voltage Vinf and then reconnects it to the top voltage Vsup as a function of the comparison signal Comp_res. This operation starts from the highest capacitance and ends with the lowest capacitance.

Depending on the voltage range that has been determined, the switching circuit with the switching logic is configured to execute conversion operations on 8 bits in the case of weak illumination, 7 bits in the case of moderate illumination or 6 bits in the case of strong illumination. At the end of the second conversion, the state of the switching signals S1 to S8 is used to supply the 8-bit binary word LSB_out that is placed in a register of the device as the eight less significant bits. Of course, depending on the area of illumination that has been determined, the last bit or bits of this binary word is or are defined arbitrarily.

Figure 8:
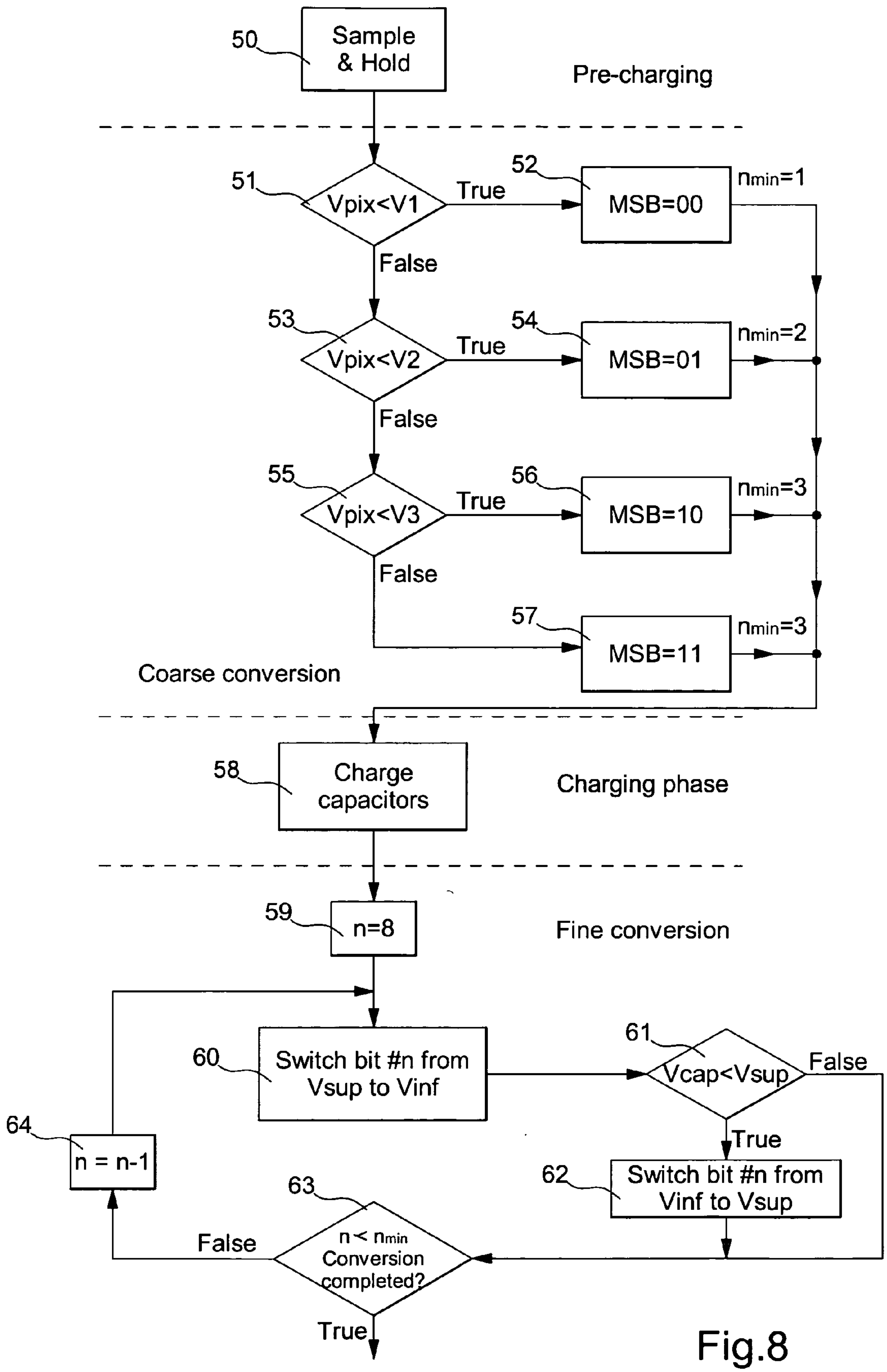
FIG. 8 represents steps of the analog-digital conversion method (algorithm) in a conversion device according to the invention.

The steps of the analog-digital conversion method are described hereinafter with reference to FIG. 8. The following table shows the states during the various steps of the method of the control signals represented in FIG. 5 that are applied to respective multiplexers:

| PHASES | S_in | S_comp | S_HL |
|---|---|---|---|
| Pre-charge | 1 | 1 | 00 |
| 1st conversion | 1 | 1 | 00, 01, 10, 11 |
| Charge | 0 | 0 | Selection |
| 2nd conversion | 1 | 0 | Selection |

The first step 50 of the analog-digital conversion method relates to a pre-charging phase in which the pixel supplies to the analog-digital conversion device a voltage relating to its illumination. As soon as the conversion device receives a stable value of the pixel voltage, the first converter is started to carry out a coarse conversion.

In the step 51, the pixel voltage Vpix is compared to the first voltage threshold V1. If this voltage Vpix is below the threshold V1, then the pixel is weakly lit and in the step 52 the first voltage range of the dynamic range is selected by the binary word whose top two more significant bits MSB have the value 00. On the other hand, if this voltage Vpix is above V1, then the signal S_HL is incremented by one unit to enable the voltage Vpix to be compared with the second voltage threshold V2 in the step 53. If the voltage Vpix is below the threshold V2, then in the step 54 the second voltage range of the dynamic range is selected by the binary word with the top two more significant bits MSB having the value 01. On the other hand, if this voltage Vpix is above V2, then the signal S_HL is incremented by one unit to enable comparison of the voltage Vpix with the third voltage threshold V3 in the step 55. If the voltage Vpix is below the threshold V3, then in the step 56 the third voltage range of the dynamic range is selected by the binary word with the top two more significant bits MSB having the value 10. On the other hand, if this voltage Vpix is above the third voltage threshold V3, then the pixel is in the most strongly illuminated area. The signal S_HL is therefore incremented by one unit in order for the fourth voltage range of the dynamic range to be selected by the binary word with the top two more significant bits MSB having the value 11 in the step 57.

In relation to the binary word of 2 bits supplied by the first converter, a minimum number $n_{min}$ is defined to stop the second converter before it starts to convert noise.

Before starting the fine conversion steps, a phase of charging the capacitors of the array of switched capacitors is carried out in the step 58, in order to sample the voltage Vpix. As may be seen in the above table, during this charging phase, in the step 58, the signals S_in and S_comp are at 0. This means that the common terminal of the capacitors at Vcap receives the top voltage of the voltage range that has been determined, whereas the switching circuit and the negative terminal of the comparator receive the pixel voltage instead of the top voltage. The array of capacitors is then charged to a voltage Vsup−Vpix.

After charging this common terminal of the capacitors, the control signal S_in goes to 1, which leaves this common terminal floating. The switching circuit again receives the top voltage Vsup of the voltage range that has been determined. This raises the voltage at the common terminal of the capacitors by the voltage Vsup, so that Vcap=(2Vsup−Vpix).

For the fine conversion effected by the second converter, the number n of conversion bits is fixed at 8 in the step 59. In the step 60, in the switching circuit, the multiplexer of the capacitor representing bit number 8 (128C) is switched from the voltage Vsup to the voltage Vinf. The voltage Vcap is tested in the step 61 in order to determine if this voltage Vcap has fallen below the voltage Vsup. If so, the multiplexer of the capacitor representing bit number 8 is switched from the voltage Vinf to the voltage Vsup in the step 62, before carrying out the end of conversion test in the step 63. On the other hand, if the voltage Vcap is higher than the voltage Vsup in the step 61, the multiplexer does not change state. If the number n is less than or equal to the minimum number $n_{min}$, the fine conversion is terminated. Otherwise, the number n is decremented by one unit and the steps 60 to 63 are executed relative to the connection of the capacitor representing bit number 7 (64C). All the steps 60 to 64 are executed successively for the connection of the other capacitors to the voltage Vinf or to the voltage Vsup, until n is less than or equal to $n_{min}$.

At the end of the fine conversion method, the second converter supplies a binary word with eight least significant bits after carrying out a conversion from 6 to 8 bits as a function of the pixel voltage range that has been determined. The least significant bit or less significant bits not converted by the second converter are fixed arbitrarily. With this analog-digital conversion method, note that the number of comparisons effected by the comparator, i.e. the total for the coarse conversion and the fine conversion, is always the same, independently of the illumination of the pixel. Thanks to the method of using the analog-digital conversion device, nine comparisons are effected for any area of illumination of the pixel. Thus the conversion device provides sufficient accuracy at weak illumination whilst avoiding converting noise unnecessarily at moderate or strong illumination.

On the basis of the description that has just been given, multiple variants of the analog-digital conversion device and method may be envisaged by the person skilled in the art that do not depart from the scope of the invention as defined by the claims. In the case of a device supplying a binary word of 10 bits, the first converter may supply a binary word of 1 bit, 3 bits or 4 bits, for example, while the second converter supplies a binary word of 9 bits, 7 bits or 6 bits. The number of illumination areas depends of course on the number of bits supplied by the first converter. Instead of a single comparator, the comparison means may comprise a plurality of comparators in parallel to compare each voltage threshold with the pixel voltage simultaneously.

What is claimed is:

1. An analog-digital conversion device in particular for an image sensor that comprises a pixel matrix photosensitive cell, having a plurality of pixels, to pick up at least one image to be digitised, the device comprising at least one N-bit first converter and at least one M-bit second converter connected to the first converter, the first and second converters being used to convert a voltage or current level of a voltage or current pixel signal to N+M bits, the voltage or current level to be converted depending on a level of light captured by each pixel in a particular voltage or current dynamic range of the sensor, the first converter comprising comparison means for comparing the voltage or current level of the pixel with one or more voltage or current thresholds delimiting successive voltage or current ranges within the dynamic range in order to supply an N-bit binary word whose value relates to a voltage or current range in which the voltage or current level of the pixel is situated, the successive voltage or current ranges within the dynamic range being used to define an illumination of a pixel, ranging from a weakly illuminated pixel to a strongly illuminated pixel, wherein the second converter comprises conversion adaptation means that are configured for the voltage or current range that has been determined between a minimum voltage or current and a maximum voltage or current of said voltage or current range as a function of the value of the N-bit binary word supplied by the first converter, the conversion adaptation means being configured to convert the voltage or current pixel signal to a number of bits less than M for a voltage or current range that has been determined corresponding to a strongly-illuminated pixel or equal to M for a voltage or current range that has been determined corresponding to a pixel that is weakly illuminated.

2. The conversion device according to claim 1, wherein it comprises a register in which are placed the N more significant bits from the first converter, which is a non-linear converter, and the M less significant bits from the second converter, which is a linear converter.

3. The conversion device according to claim 1, wherein the first converter supplies a binary word comprising two more significant bits whose value represents one of four voltage ranges of the voltage dynamic range and wherein the conversion adaptation means of the second converter enable the second converter to effect conversion on 8 bits if the voltage level of the pixel is in a first voltage range corresponding to the weakly illuminated pixel, conversion on 7 bits if the voltage level of the pixel is in a second voltage range corresponding to a moderately illuminated pixel, or conversion on 6 bits if the voltage level of the pixel is in third or fourth voltage ranges corresponding to the strongly illuminated pixel, some less significant bits not converted by the second converter being defined arbitrarily by a switching circuit of the second converter so that the first and second converters supply a 10-bit binary word.

4. The conversion device according to claim 1, wherein it is configured so that the size of each voltage or current range of the dynamic range has a size that depends on sensitivity of the sensor, the size of the voltage or current range corresponding to the weakly illuminated pixel being smaller than the size of the voltage or current range corresponding to a moderately or the strongly illuminated pixel so as to increase sensitivity of the second converter for the conversion operations in a manner such that the converter has a sensitivity adapted to that of the sensor.

5. The conversion device according to claim 4, wherein the size of a first voltage range corresponding to the weakly illuminated pixel is defined so that a sensitivity per conversion bit of the second converter corresponds to an equivalent sensitivity per bit of a linear converter of N+M+k bits, in particular an 11-bit converter, over a whole of the voltage or current dynamic range, and wherein the size of a last voltage range corresponding to a strongly illuminated pixel is defined so that the sensitivity per conversion bit of the second converter corresponds to a substantially equivalent sensitivity per bit of a linear converter of N+M−1 bits, in particular an 8-bit converter, over a whole of the voltage or current dynamic range, to take account of a noise factor $2^{k-1}$ times, in particular 8 times higher for the strongly illuminated pixel compared to the weakly illuminated pixel.

6. The conversion device according to claim 1, wherein the first converter comprises a demultiplexer controlled by a first control signal supplied by a control signal generator to connect the voltage or current signal of a pixel to a first input of the comparison means, such as a comparator, or to a first input of a switching circuit of the second converter during a charging phase, a first multiplexer receiving at its input the voltage or current thresholds delimiting the voltage or current ranges and the upper limit voltage or current value of the dynamic range, the first multiplexer being controlled by a second control signal supplied by said control signal generator to connect one of he voltage or current thresholds to a second input of the comparator, and the output of the comparator being connected to the control signal generator to modify or maintain a state of the second control signal as a function of the result of comparing the voltage or current signal of the pixel with one of the voltage or current thresholds.

7. The conversion device according to claim 6, wherein the second converter comprises an array of switched capacitors, a switching circuit for controlling the connection of capacitors of said array, and a second multiplexer controlled by the second control signal supplied by said control signal generator, said second multiplexer receiving at its input a bottom voltage or current limit value of the dynamic range, the voltage or current thresholds for supplying the bottom voltage of the voltage range that has been determined to a second input of the switching circuit depending on the binary word supplied by the first converter, the binary word being defined by the state of the N-bit, preferably 2-bit, second control signal, and the first input of the swiching circuit receiving from the first multiplexer a top voltage or current of the voltage or current range that has been determined.

8. The conversion device according to claim 7, wherein the second converter comprises a third multiplexer connected between the demultiplexer and the comparator, the third multiplexer being controlled by a third control signal supplied by the control signal generator in such a manner as to connect a terminal of the switched capacitor array to the comparator of the first converter in a conversion phase of the second converter, and wherein the second converter operates between top and bottom voltages of the voltage range determined by the binary word supplied by the first converter to convert the voltage or current level to a number of bits less than or equal to M.

9. An image sensor comprising a pixel matrix photosensitive cell for picking up an image to be digitised, at least one analog-digital conversion device according to claim 1, an illumination averaging unit connected to an output of the conversion device, and a scale adapter connected to the output of the conversion device and receiving a control signal from the averaging unit, wherein the conversion device comprises a plurality of first and second converters connected in parallel in such a manner that each converts to N+M bits a voltage or current signal supplied by a corresponding pixel, and wherein the averaging unit receives the result of the conversion of the voltage or current level of each pixel to supply the control signal to the adapter in order for it to supply at its output a binary word of K bits selected from within each binary word of N+M bits supplied by the conversion device as a function of an illumination average determined by said averaging unit.

10. An image sensor according to claim 9, wherein the conversion device supplies a 10-bit binary word relating to the voltage or current level of each pixel and wherein the scale adapter selects eight successive bits from each 10-bit binary word as a function of the illumination average determined by said averaging unit.

11. An analog-digital conversion method for operating the conversion device according to claim 1, in particular in the image sensor that comprises the pixel matrix photosensitive cell for picking up the at least one image to be digitised, wherein said method comprises the following series of steps:

comparing in the first converter the voltage or current level of the pixel with at least one voltage or current threshold delimiting successive voltage or current ranges within the dynamic range, supplying an N-bit binary word whose value relates to the voltage or current range in which the voltage or current level of the pixel is situated, the successive voltage or current ranges within the dynamic range being used to define the illumination of a pixel, ranging from a weakly illuminated pixel to a strongly illuminated pixel, configuring the second converter by the voltage or current range that has been determined between a minimum voltage or current and a maximum voltage or current of said voltage or current range as a function of the value of the N-bit binary word supplied by the first converter, and converting in the second converter the voltage or current level of the pixel to a number of bits less than M for a voltage or current range that has been determined corresponding to a moderately or strongly illuminated pixel or equal to M for a voltage or current range that has been determined corresponding to a weakly illuminated pixel.

12. The conversion method according to claim 11, wherein the first converter supplies a binary word comprising two more significant bits whose value represents one of four voltage ranges within the voltage dynamic range, the size of the first voltage range corresponding to a weakly illuminated pixel being smaller than the size of the voltage ranges corresponding to a moderately or strongly illumi nated pixel, and wherein the second converter effects conversion on 8 bits if the voltage level of the pixel is in a first voltage range corresponding to a weakly illuminated pixel, on 7 bits if the voltage level of the pixel is in a second voltage range corresponding to a moderately illuminated pixel, and on 6 bits if the voltage level of the pixel is in third or fourth voltage ranges corresponding to a strongly illuminated pixel, some less significant bits not converted by the second converter being defined arbitrarily by a switching circuit of the second converter so that conversion device supplies a 10-bit binary word.

13. The conversion method according to claim 11, wherein the first and second converters effect analog-digital conversion successively, thus enabling the use of a single comparator for comparison steps of both converters with the voltage or current thresholds of the dynamic range.

* * * * *